(12) United States Patent
Goeke

(10) Patent No.: US 8,410,804 B1
(45) Date of Patent: Apr. 2, 2013

(54) MEASUREMENT SYSTEM WITH HIGH FREQUENCY GROUND SWITCH

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 313 days.

(21) Appl. No.: 12/391,863

(22) Filed: Feb. 24, 2009

(51) Int. Cl.
*G01R 31/20* (2006.01)

(52) U.S. Cl. ............. 324/754.01; 324/754.07; 324/72.5; 324/121 R; 324/754.02; 324/754.03; 324/755.02

(58) Field of Classification Search .............. 702/66–67; 324/754.07, 72.5, 121 R, 754.01, 754.02, 324/754.03, 755.02
See application file for complete search history.

(56) References Cited

U.S. PATENT DOCUMENTS

| | | | | |
|---|---|---|---|---|
| 4,928,062 A * | 5/1990 | Miles et al. | ............. | 324/754.07 |
| 5,631,565 A * | 5/1997 | Winter | ......................... | 324/511 |
| 5,818,243 A * | 10/1998 | Wakamatsu | ................... | 324/649 |
| 6,175,228 B1 * | 1/2001 | Zamborelli et al. | ......... | 324/72.5 |
| 6,229,327 B1 * | 5/2001 | Boll et al. | ................ | 324/755.02 |
| 6,704,670 B2 * | 3/2004 | McTigue | ........................ | 702/66 |
| 6,944,559 B2 * | 9/2005 | Hiltner | ............................ | 702/67 |
| 7,388,366 B2 | 6/2008 | Goeke | | |
| 2004/0102909 A1 * | 5/2004 | Hiltner | ............................ | 702/67 |
| 2005/0134255 A1 * | 6/2005 | Tanaka et al. | ............. | 324/158.1 |
| 2005/0237078 A1 * | 10/2005 | Cannon et al. | ................ | 324/762 |
| 2005/0253603 A1 * | 11/2005 | Capps et al. | .................. | 324/754 |
| 2006/0061348 A1 * | 3/2006 | Cannon et al. | ............... | 324/72.5 |
| 2006/0152234 A1 * | 7/2006 | Miller | .......................... | 324/754 |
| 2006/0267602 A1 * | 11/2006 | Yang et al. | ..................... | 324/754 |
| 2006/0267603 A1 * | 11/2006 | Yang | ............................ | 324/754 |
| 2006/0267604 A1 * | 11/2006 | Yang | ............................ | 324/754 |
| 2006/0279299 A1 * | 12/2006 | Campbell et al. | ............. | 324/754 |
| 2007/0182429 A1 * | 8/2007 | Goeke | ........................... | 324/754 |
| 2008/0012591 A1 * | 1/2008 | Campbell et al. | ............. | 324/754 |
| 2008/0054917 A1 * | 3/2008 | Henson et al. | ................ | 324/754 |
| 2008/0074129 A1 * | 3/2008 | Hayden et al. | ................. | 324/754 |
| 2009/0079451 A1 * | 3/2009 | Campbell et al. | ............. | 324/754 |
| 2009/0153159 A1 * | 6/2009 | Reed et al. | ..................... | 324/754 |
| 2009/0167332 A1 * | 7/2009 | Forbes | .......................... | 324/754 |
| 2010/0102839 A1 * | 4/2010 | Washburn | ..................... | 324/754 |
| 2010/0201388 A1 * | 8/2010 | Forbes | .......................... | 324/754 |
| 2011/0210759 A1 * | 9/2011 | Suto | ........................ | 324/754.03 |

OTHER PUBLICATIONS

"Agilent 8720E Family Network Analyzers", Agilent Technologies, p. 1-12, Jul. 13, 2006 (Agilent_2006).*
"Instrument Messages and Functional Tests: Agilent Technologies EMC Series Analyzers", Agilent Technologies, p. 1-105, Dec. 2001 (Agilent_2001).*
Paul Pino, "Distortion Inherent to VNA Test Port Cable Assemblies", Microwave Journal, p. 1-5, Sep. 2006 (Pino_2006).*
Peroutka et al., "Adverse Effects in Voltage Source Inverter-Fed Drive Systems", Applied Power Electronics Conference and Exposition, 2002, p. 557-563 (Peroutka_2002).*
Hampton et al. "Effect of size on electrical performance", 2006 IEEE International Symposium on Electrical Insulation, p. 25-29 (Hampton_2006).*

* cited by examiner

*Primary Examiner* — Patrick Assouad
*Assistant Examiner* — Lamarr Brown
(74) *Attorney, Agent, or Firm* — Pearne & Gordon LLP

(57) ABSTRACT

A system for making high frequency measurements on a DUT includes a high frequency measurement instrument; a plurality of DUT probes; a first coaxial cable having a center conductor and a coaxial conductor for connection between the instrument and a first DUT probe; and a second coaxial cable having a center conductor and a coaxial conductor for connection between the instrument and a second DUT probe, at least one of the first and second cables being selectively shortable between the respective center conductor and coaxial conductor at a location near the respective DUT probe.

2 Claims, 2 Drawing Sheets

MEASUREMENT SYSTEM WITH HIGH FREQUENCY GROUND SWITCH

BACKGROUND OF THE INVENTION

The present invention relates to precision electrical measurement systems and, in particular, to cabling for measurement systems.

Semiconductor device characterization requires a diverse array of measurements in order to understand a semiconductor device's electrical characteristics and to understand the processes used to manufacture it. IV, CV, and pulse-based measurements are the most common measurements made. It is valuable to strive to integrate these measurements in order to reduce the time and effort required to make these measures. One of the most difficult problems associated with integrating these measurements is that the cabling required for each measurement type is fundamentally different.

Cabling for precision DC measurements tends to focus on forcing and sensing electrical values as physically close to the device under test (DUT) as possible and trying to minimize leakage currents through such techniques as guarding conductors with adjacent conductors having an equal potential. A coaxial cable can be used for this by forcing and measuring on center conductors and guarding on the coaxial conductor.

Cabling for high frequency (HF) measurements such as RF and pulse measurements have a substantial focus on providing a characteristic impedance that matches that of the measurement instrument.

Referring to FIG. 1, cabling for a pulse measurement system 1 has the outer coaxial conductors of the cables at the DUT ends of the cables tied together to provide the HF ground 2 on the DUT.

This connection of the outer coaxial conductors to the DUT is in general opposition to DC measurements where typically only the center conductors are connected to the DUT.

SUMMARY OF THE INVENTION

A system for making high frequency measurements on a DUT includes a high frequency measurement instrument; a plurality of DUT probes; a first coaxial cable having a center conductor and a coaxial conductor for connection between the instrument and a first DUT probe; and a second coaxial cable having a center conductor and a coaxial conductor for connection between the instrument and a second DUT probe, at least one of the first and second cables being selectively shortable between the respective center conductor and coaxial conductor at a location near the respective DUT probe.

DESCRIPTION OF THE PREFERRED EMBODIMENTS

Figure 1:
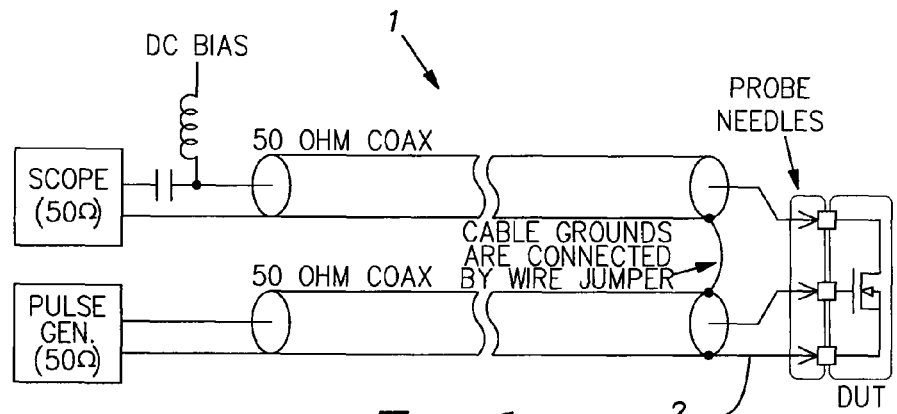
FIG. 1 is a schematic diagram of a prior art measurement system.
Figure 2:
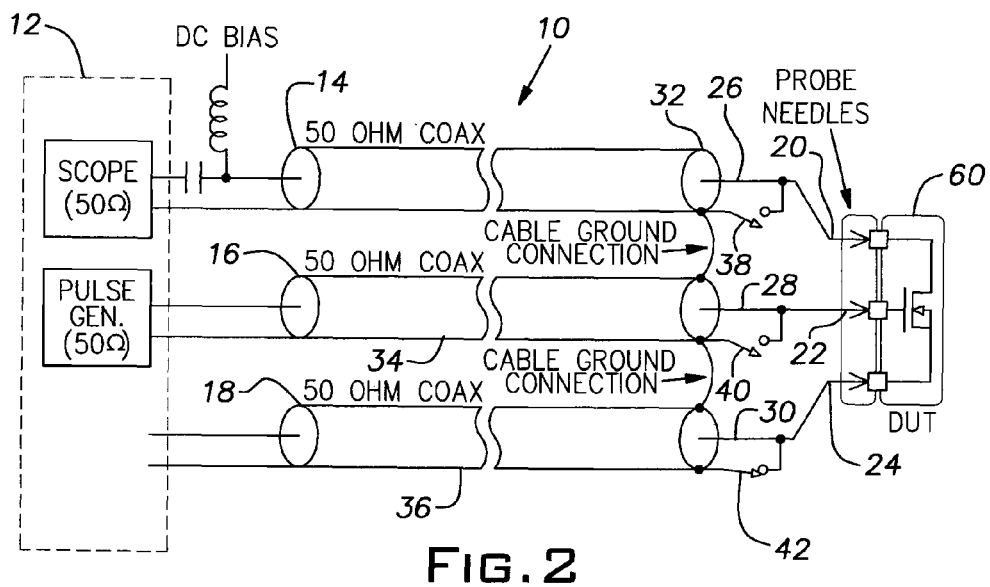
FIG. 2 is a schematic diagram of a measurement system according to an aspect of the invention.

Referring to FIG. 2, an HF measurement system 10 for measuring HF characteristics of the DUT 60 includes a measurement device 12, coaxial cables 14, 16, 18 and DUT probes 20, 22, 24. Each coaxial cable center conductor 26, 28, 30 is attached to the respective DUT probe. The coaxial conductor 32, 34, 36 are connected in common at the DUT end of the cables 14, 16, 18.

A switch 38, 40, 42 is provide at each DUT end of the cables 14, 16, 18 to permit shorting each center conductor 26, 28, 30 to the respective coaxial conductor 32, 34, 36.

This configuration allows the cables 14, 16, 18 to be connected to the DUT probes 20, 22, 24 in the typical DC measurement manner (center conductors to probes) while HF ground can be supplied to any of the probes 20, 22, 24 by closing the respective switch 38, 40, 42. It is desirable for the switches to be as close as possible to the DUT 60 to preserve the characteristic impedance of the cables when making HF measurements.

The measurement instrument 12 may include, for example, a pulse generator and an oscilloscope, an RF generator and an impedance meter, or other HF source and HF measuring device.

The switches 38, 40, 42 may be, for example, controlled manually or under software control provided by the measurement instrument or an unshown system controller.

The system 10 provides center conductor cabling to each DUT probe while permitting any of the DUT probes to be connected to HF common or ground. This permits the cabling to be used for both HF and DC measurements without re-cabling the DUT probes. For DC measurements the center conductors are used for force and sense, with the coaxial conductors each provided with a virtual copy of the signal on the center conductor to guard the center conductor from, for example, leakage currents. For HF measurements, the HF signals are transmitted on a coaxial cable with the desired characteristic impedance and any needed signal ground connection to the DUT probes can be provided by selecting the switches 38, 40, 42 to short the respective cable.

Figure 3:
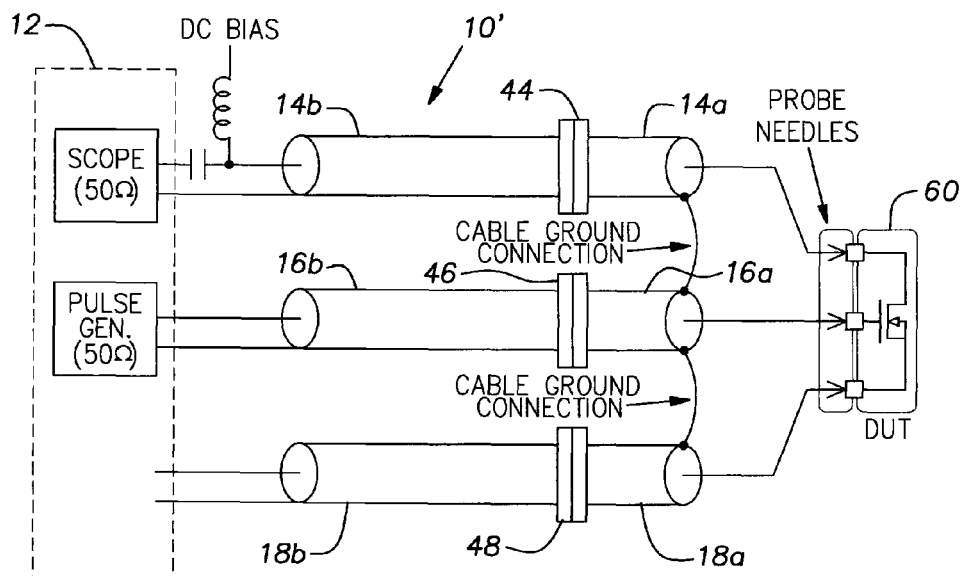
FIG. 3 is a schematic diagram of a measurement system according to another aspect of the invention.
Figure 4:
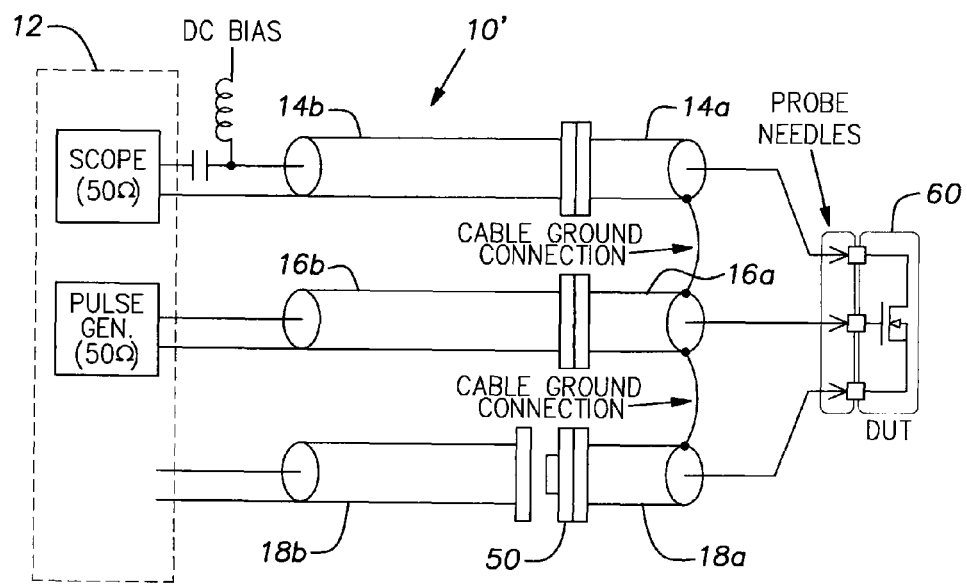
FIG. 4 is a schematic diagram of the measurement system of FIG. 3 with one of the cables shorted.

Referring to FIG. 3, a similar HF measurement system 10' for measuring HF characteristics of the DUT 60 has the cables 14, 16, 18 divided into short 14a, 16a, 18a and long portions 14b, 16b, 18b, respectfully. The long and short portions are joined by the coaxial connectors 44, 46, 48. The short portions 14a, 16a, 18a may be selectively shorted by disconnecting a respective coaxial connector 44, 46, 48 and installing a shorting connector (e.g., a coax connector with an integral electrical short between the center and outer conductor) 50 in place of the respective long portion 14b, 16b 18b (see, FIG. 4)

While it is in general desirable to have the shorts as close as possible to the DUT, it has been found that excellent performance can still be had as long as the short is near the DUT. The overall length of the cables may be, for example, greater than five feet and the short portions less than two feet. In this case bandwidth may be 30 MHz with 10 ns rise times.

This configuration still allows the cabling at the DUT probes to be undisturbed when changing from DC to HF measurements. In addition, it is possible to quickly ground chosen test points.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A system for making high frequency measurements on a DUT, said system comprising:
   a high frequency measurement instrument;
   a plurality of DUT probes;
   a first coaxial cable having a center conductor and a coaxial conductor for connection between said instrument and a first DUT probe;
   a second coaxial cable having a center conductor and a coaxial conductor for connection between said instrument and a second DUT probe; and
   a switch operable to selectively connect said second coaxial cable center conductor to said second cable coaxial conductor at a location near the second DUT probe.

2. A system according to claim 1, wherein said switch is at the second DUT probe.

* * * * *